United States Patent
Li

(10) Patent No.: US 11,276,364 B2
(45) Date of Patent: Mar. 15, 2022

(54) SHIFT REGISTER, DRIVING METHOD THEREOF, DRIVING CONTROL CIRCUIT AND DISPLAY DEVICE

(71) Applicant: Shanghai Tianma AM-OLED Co., Ltd., Shanghai (CN)

(72) Inventor: Yue Li, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 317 days.

(21) Appl. No.: 16/730,175

(22) Filed: Dec. 30, 2019

(65) Prior Publication Data

US 2021/0082368 A1  Mar. 18, 2021

(30) Foreign Application Priority Data

Sep. 18, 2019  (CN) .......................... 201910880387.7

(51) Int. Cl.
| | |
|---|---|
| *G09G 3/3266* | (2016.01) |
| *G09G 3/36* | (2006.01) |
| *G09G 5/00* | (2006.01) |
| *G11C 19/28* | (2006.01) |

(52) U.S. Cl.
CPC ............ *G09G 5/003* (2013.01); *G11C 19/28* (2013.01); *G09G 3/3674* (2013.01); *G09G 2300/0861* (2013.01); *G09G 2310/0278* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 2012/0087459 | A1 | 4/2012 | Nakamizo |
| 2016/0019833 | A1* | 1/2016 | Wei ....................... G09G 3/3266 |
| | | | 345/690 |
| 2017/0004889 | A1* | 1/2017 | Li ......................... G09G 3/3266 |
| 2017/0221578 | A1 | 8/2017 | Xiao |
| 2017/0269769 | A1* | 9/2017 | Hu ....................... G06F 3/04166 |
| 2018/0047327 | A1* | 2/2018 | Wang ................... G11C 19/184 |

FOREIGN PATENT DOCUMENTS

| | | |
|---|---|---|
| CN | 105185309 A | 12/2015 |
| CN | 105304013 A | 2/2016 |
| CN | 105405381 A | 3/2016 |
| CN | 103632633 B | 8/2016 |
| CN | 107123390 A | 9/2017 |
| CN | 107863057 A | 3/2018 |

* cited by examiner

*Primary Examiner* — Joni Hsu
(74) *Attorney, Agent, or Firm* — Alston & Bird LLP

(57) ABSTRACT

Provided are a shift register, a driving method thereof, a driving control circuit and a display device. A first reference signal of a first reference signal end may be provided to a first node through an input sub-circuit. A first node signal of the first node and a second node signal of a second node may be controlled through a driving control sub-circuit. The first reference signal of the first reference signal end may be provided to a signal output end and a second reference signal of a second reference signal end may be provided to the signal output end through an output sub-circuit. Through the arrangement of a first capacitor electrically connected between a second clock signal end and the first node, a level of the first node may be kept stable through the first capacitor. A second node signal of the second node and a third node signal of a third node may be controlled through a protection sub-circuit.

20 Claims, 9 Drawing Sheets

SHIFT REGISTER, DRIVING METHOD THEREOF, DRIVING CONTROL CIRCUIT AND DISPLAY DEVICE

CROSS REFERENCE TO RELATED APPLICATIONS

This application claims priority to Chinese Patent Application No. CN 201910880387.7, filed on Sep. 18, 2019, which is hereby incorporated by reference in its entirety.

FIELD

The present disclosure relates to the field of display devices, and, more particularly, to a shift register, a driving method thereof, a driving control circuit and a display device.

BACKGROUND

With the rapid development of display technologies, display devices are increasingly developed with an aim toward high integration and low cost. A GOA (Gate Driver on Array) technology integrates a TFT (Thin Film Transistor) driving circuit on an array substrate of a display device to perform signal driving. The driving circuit is generally composed of a plurality of cascaded shift registers.

However, outputs of the cascaded shift registers are unstable, which may cause display abnormality.

SUMMARY

Embodiments of the present disclosure provide a shift register, a driving method thereof, a driving control circuit and a display device so as to improve the stability of signal output.

An embodiment of the present disclosure provides a shift register, including: an input sub-circuit, configured to provide a first reference signal of a first reference signal end to a first node in response to a first clock signal of a first clock signal end; a first capacitor, electrically connected between a second clock signal end and the first node; a driving control sub-circuit, configured to control a first node signal of the first node and a second node signal of a second node according to an input signal of an input signal end, the first clock signal of the first clock signal end and a second clock signal of the second clock signal end; a protection sub-circuit, configured to control the second node signal of the second node and a third node signal of a third node in response to the first reference signal of the first reference signal end; and an output sub-circuit, configured to provide the first reference signal of the first reference signal end to a signal output end in response to the third node signal of the third node, and provide a second reference signal of a second reference signal end to the signal output end in response to the first node signal of the first node and the second clock signal of the second clock signal end.

An embodiment of the present disclosure further provides a driving control circuit, including a plurality of the above-mentioned cascaded shift registers.

A signal input end of a first stage of shift register is electrically connected to a frame triggering signal end.

In every two adjacent stages of shift registers, a signal input end of the next stage of shift register is electrically connected to a signal output end of the previous stage of shift register.

An embodiment of the present disclosure further provides a display device, including the above-mentioned shift register.

An embodiment of the present disclosure further provides a driving method of the above-mentioned shift register, including the following phases.

An input phase: loading a first signal at a first level to the input signal end, loading a second signal at a second level to the first clock signal end, and loading the first signal at the first level to the second clock signal end.

An output phase: loading the second signal at the second level to the input signal end, loading the first signal at the first level to the first clock signal end, and loading the second signal at the second level to the second clock signal end.

A reset phase: loading the second signal at the second level to the input signal end, loading the second signal at the second level to the first clock signal end, and loading the first signal at the first level to the second clock signal end.

A reset holding phase: loading the second signal at the second level to the input signal end, loading the first signal at the first level to the first clock signal end, and loading the second signal at the second level to the second clock signal end.

The present disclosure has the following beneficial effects.

According to the shift register, the driving method thereof, the driving control circuit and the display device which are provided by the embodiments of the present disclosure, the signal of the first reference signal end may be provided to the first node through the input sub-circuit in response to the signal of the first clock signal end. The signals of the first node and the second node may be controlled by the driving control sub-circuit according to the signals of the input signal end, the first clock signal end and the second clock signal end. The signal of the first reference signal end may be provided to the signal output end in response to the signal of the third node, and the signal of the second reference signal end may be provided to the signal output end in response to the signals of the first node and the second clock signal end by the output sub-circuit. Through the arrangement of the first capacitor electrically connected between the second clock signal end and the first node, a level of the first node may be kept stable through the first capacitor. The signals of the second node and the third node may be controlled through the protection sub-circuit in response to the signal of the first reference signal end, therefore, when the third node is further pulled down, the third node and the second node may be disconnected to prevent the second node from being further pulled down, thereby reducing influences of the signal of the second node to the driving control sub-circuit, and thus, improving the output stability of the shift register.

DETAILED DESCRIPTION OF THE EMBODIMENTS

Unless otherwise defined, technical terms or scientific terms used in the present disclosure shall be ordinary meanings as understood by those of ordinary skilled in the art of the present disclosure. The words "first", "second" and similar terms used in the present disclosure do not denote any order, quantity or importance, but are merely used to distinguish different components. The word "including" or "includes" or the like means that the element or object preceding the word covers the element or object listed after the word and its equivalent, without excluding other elements or objects. The words "connection" or "connected" and the like are not limited to physical or mechanical connections, but may include electrical connections, whether direct or indirect.

It should be noted that the sizes and shapes of all patterns in the accompanying drawings are not drawn to scale, and are merely to illustrate the contents of the present disclosure. Furthermore, same or similar numerals throughout indicate same or similar elements or elements with same or similar functions.

Figure 1:
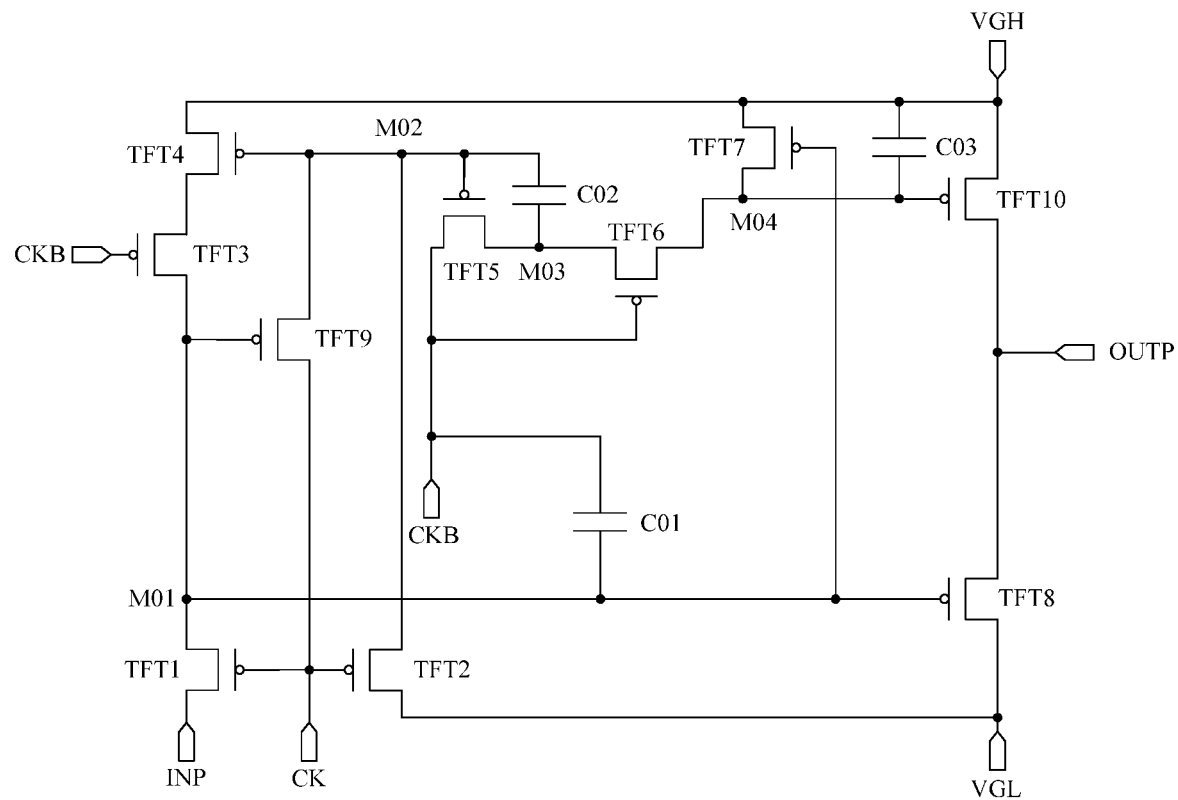
FIG. 1 is a structural schematic diagram of a conventional shift register.
Figure 2:
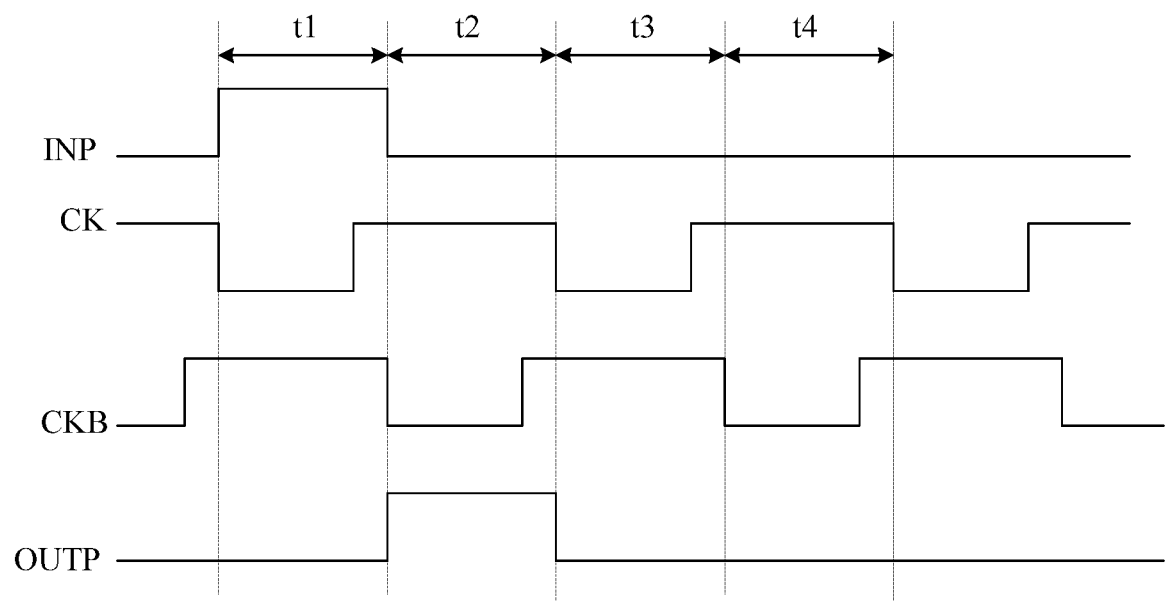
FIG. 2 is a circuit sequence diagram of the shift register shown in FIG. 1.

As shown in FIG. 1, a shift register includes: transistors TFT1 to TFT10 and capacitors C01 to C03. A corresponding sequence diagram is shown in FIG. 2.

In a t1 phase, since a clock signal CK is at a low level, the transistor TFT1 and the transistor TFT2 are both on. The on transistor TFT1 enables a level of a node M01 to be a high level, and the transistor TFT7, the transistor TFT8 and transistor TFT9 are all off. The on transistor TFT2 enables a level of a node M02 to be a low level, so that the transistor TFT5 is on to enable a level of a node M03 to be a high level. Since a clock signal CKB is at a high level, the transistor TFT6 is off. A node M04 is maintained at a high level, so that an output signal end OUTP maintains the signal at the low level in the previous phase.

In a t2 phase, since the clock signal CK is at a high level, the transistor TFT1 and the transistor TFT2 are both off, and the node M02 is in a floating state. The level of the node M02 is maintained at a low level due to the action of the capacitor 02, so that the transistor TFT4 and the transistor TFT5 are both on. Since the clock signal CKB is at a low level, the transistor TFT3 and the transistor TFT6 are both on. The on transistors TFT3 and TFT4 enable the level of the node M01 to be a high level, so that the transistor TFT7, the transistor TFT8 and the transistor TFT9 are all off. The on transistors TFT5 and TFT6 enable the level of the node M04 to be a low level, so that the transistor TFT10 is on to allow the output signal end OUTP to output a signal at the high level, thus completing output.

In a t3 phase, since the clock signal CK is at a low level, the transistor TFT1 and the transistor TFT2 are both on. The on transistor TFT1 enables the level of the node M01 to be a low level, and the transistor TFT7, the transistor TFT8 and the transistor TFT9 are all on. The on transistor TFT7 enables the level of the node M04 to be a high level so as to control the transistor TFT10 to be off. The on transistor TFT9 and the on transistor TFT2 enable the level of the node M02 to be a low level, so that the transistor TFT5 is on to enable the level of the node M03 to be a high level. Since the clock signal CKB is at a high level, the transistor TFT6 is off. The on transistor TFT8 enables the output signal end OUTP to output a signal at a low level, thus completing output reset.

In a t4 phase, since the clock signal CK is at the high level, the transistor TFT1 and the transistor TFT2 are both off. The level of the node M01 is maintained at a low level due to the action of the capacitor C01, and the clock signal CBK jumps from the high level to the low level. Due to the coupling action of the capacitor C01, the node M01 is further pulled down to enable the transistor TFT7, the transistor TFT8 and the transistor TFT9 to be all on. The on transistor TFT7 enables the level of the node M04 to be a high level, so as to control the transistor TFT10 to be off. The on transistor TFT9 enables the level of the node M02 to be a high level, so that the transistor TFT5 is off. The node M03 is maintained at a high level under the action of the capacitor C02. The on transistor TFT8 enables the output signal end OUTP to output a signal at a low level so as to maintain output at the low level.

However, it can be known through simulation that when a threshold voltage of the transistor in the shift register shifts to −3.5 V, the shift register may not work normally. Accordingly, a strict device size is needed, and the process and preparation requirements are relatively high. This results in an increase in process difficulty.

For example, a dark spot repair test is generally done before a display device with the shift register shown in FIG. 1 leaves a factory. In the test process, high-level voltages of the clock signals CK and CKB are increased from 8 V to 15 V. In this way, when the shift register is in the t4 phase, since the node M01 is further pulled down, the voltage of the node M01 may be increased to −30 V, and the transistor TFT9 is at a higher gate-source voltage $V_{gs}$ (a voltage difference of the gate of the transistor TFT9 and the node M02) for a long time, which thus causes the positive bias of the threshold voltage of the transistor TFT9, and then, causes higher leakage current of the transistor TFT9.

In this way, when the shift register works normally, in the t2 phase, the leakage current of the transistor TFT9 is larger, and the clock signal CK is a high-level signal, thereby causing the level of the node M02 to be pulled up and causing the transistor TFT5 to fail to be on normally, so that the node M03 may not be pulled down normally, the node M04 still remains the high level in the t2 phase, and then, the transistor TFT10 is off, which causes the output signal end OUTP to fail in normally outputting the high-level signal and makes the shift register not work normally.

Figure 3:
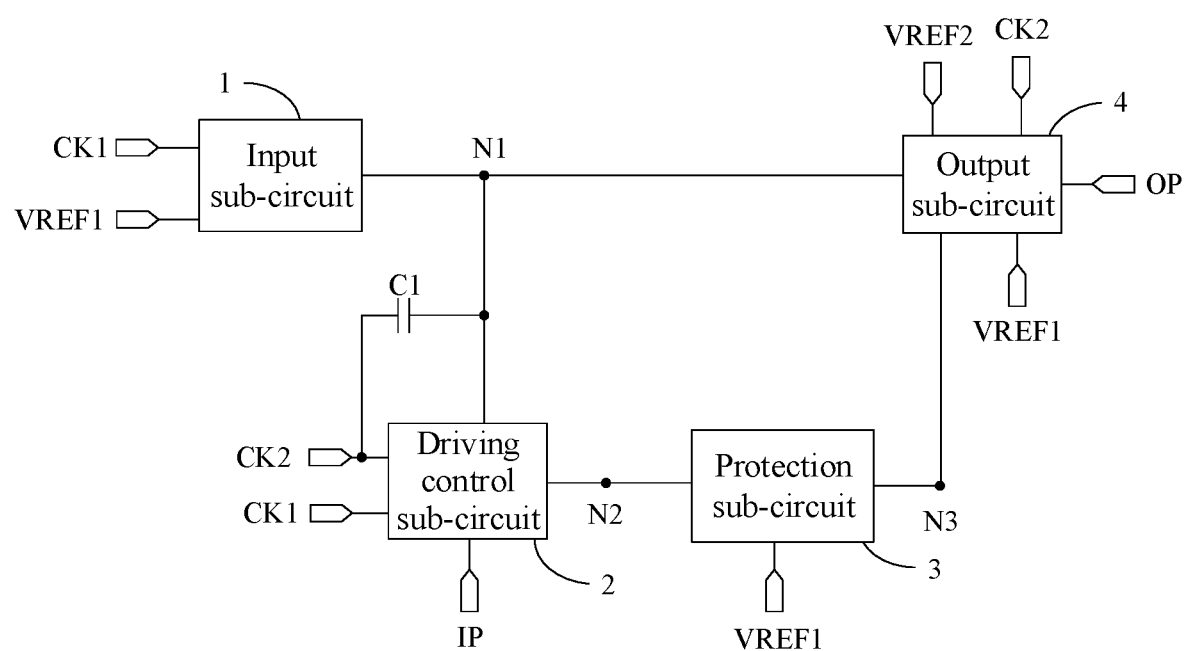
FIG. 3 is a structural schematic diagram of a shift register provided by an embodiment of the present disclosure.

An embodiment of the present disclosure provides a shift register, as shown in FIG. 3, which may include: an input sub-circuit 1, a first capacitor C1, a driving control sub-circuit 2, a protection sub-circuit 3 and an output sub-circuit 4.

An input sub-circuit 1 is configured to provide a first reference signal of a first reference signal end VREF1 to a first node N1 in response to a first clock signal of a first clock signal end CK1.

A first capacitor C1 is electrically connected between a second clock signal end CK2 and the first node N1.

A driving control sub-circuit 2 is configured to control a first node signal of the first node N1 and a second node signal of a second node N2 according to an input signal of an input signal end IP, the first clock signal of the first clock signal end CK1 and a second clock signal of the second clock signal end CK2.

A protection sub-circuit 3 is configured to control the second node signal the second node N2 and a third node signal of a third node N3 in response to the first reference signal of the first reference signal end VREF1.

An output sub-circuit 4 is configured to provide the first reference signal of the first reference signal end VREF1 to a signal output end OP in response to the third node signal of the third node N3, and further configured to provide a second reference signal of a second reference signal end VREF2 to the signal output end OP in response to the first node signal of the first node N1 and the second clock signal of the second clock signal end CK2.

According to the shift register provided by the embodiment of the present disclosure (for example, as shown in FIG. 3), the first reference signal of the first reference signal end may be provided to the first node through the input sub-circuit in response to the first clock signal of the first clock signal end. The first node and second node signals of the first node and the second node may be controlled through the driving control sub-circuit according to the input signal of the input signal end, the first clock signal of the first clock signal end and the second clock signal of the second clock signal end. The first reference signal of the first reference signal end may be provided to the signal output end in response to the third node signal of the third node, and the second reference signal of the second reference signal end may be provided to the signal output end in response to the first node signal of the first node and the second clock signal of the second clock signal end through the output sub-circuit. Through the arrangement of the first capacitor electrically connected between the second clock signal end and the first node, a level of the first node may be kept stable through the first capacitor. The second node and third node signals of the second node and the third node, respectively, may be controlled through the protection sub-circuit in response to the first reference signal of the first reference signal end, therefore, when the third node is further pulled down, the third node and the second node may be disconnected to prevent the second node from being further pulled down, thereby reducing influences of the second node signal of the second node to the driving control sub-circuit and then, improving the output stability of the shift register.

Figure 4:
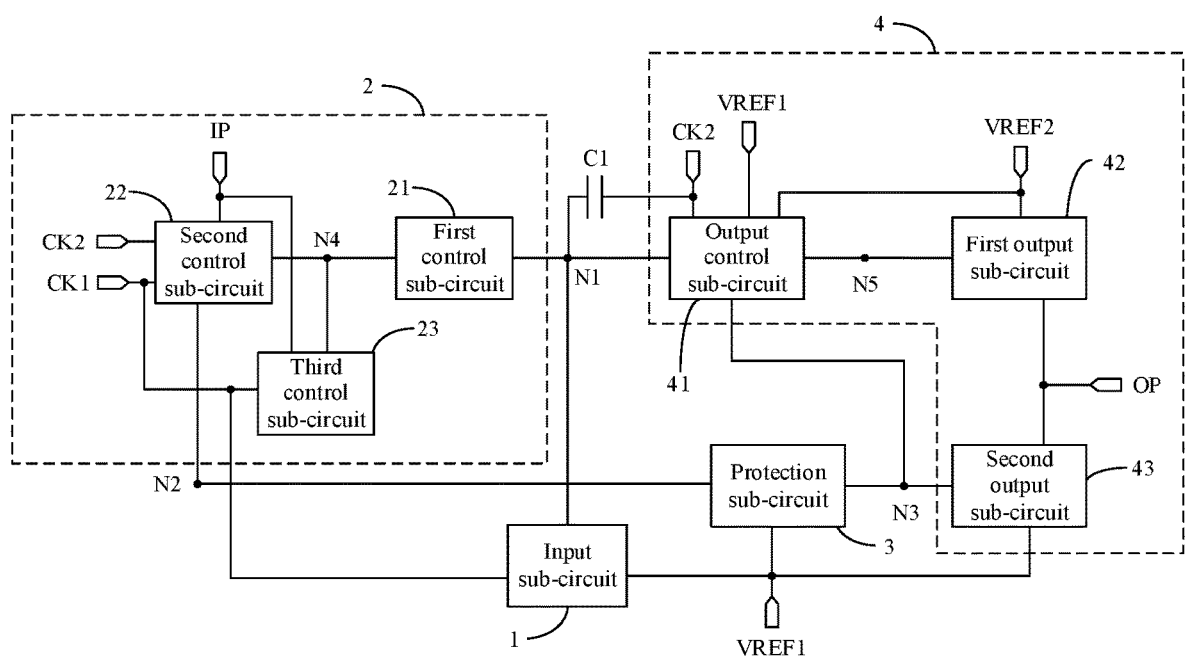
FIG. 4 is a structural schematic diagram of another shift register provided by an embodiment of the present disclosure.

In the embodiments of the present disclosure, as shown in FIG. 4, an exemplary driving control sub-circuit 2 includes: a first control sub-circuit 21, a second control sub-circuit 22 and a third control sub-circuit 23.

The first control sub-circuit 21 is configured to control the first node and fourth node signals of the first node N1 and the fourth node N4, respectively.

The second control sub-circuit 22 is configured to control the second node signal of the second node N2 according to the input signal of the input signal end IP, the first clock signal of the first clock signal end CK1, the second clock signal of the second clock signal end CK2 and the fourth node signal of the fourth node N4.

The third control sub-circuit 23 is configured to control a fourth node signal of a fourth node N4 according to the first clock signal of the first clock signal end CK1 and the input signal of the input signal end IP.

In the embodiments of the present disclosure, as shown in FIG. 4, the output sub-circuit 4 includes: an output control sub-circuit 41, a first output sub-circuit 42 and a second output sub-circuit 43.

The output control sub-circuit 41 is configured to provide the first reference signal of the first reference signal end VREF1 to a fifth node N5 in response to the first node signal of the first node N1 and the second clock signal of the second clock signal end CK2, and further configured to provide the second reference signal of the second reference signal end VREF2 to the fifth node N5 in response to the third node signal of the third node N3.

The first output sub-circuit 42 is configured to provide the second reference signal of the second reference signal end VREF2 to the signal output end OP in response to the fifth node signal of the fifth node N5.

The second output sub-circuit 43 is configured to provide the first reference signal of the first reference signal end VREF1 to the signal output end OP in response to the third node signal of the third node N3.

The present disclosure is described in detail below in conjunction with some embodiments. It shall be noted that the present embodiment is merely used to explain the present disclosure, rather than to limit the present disclosure.

Figure 5:
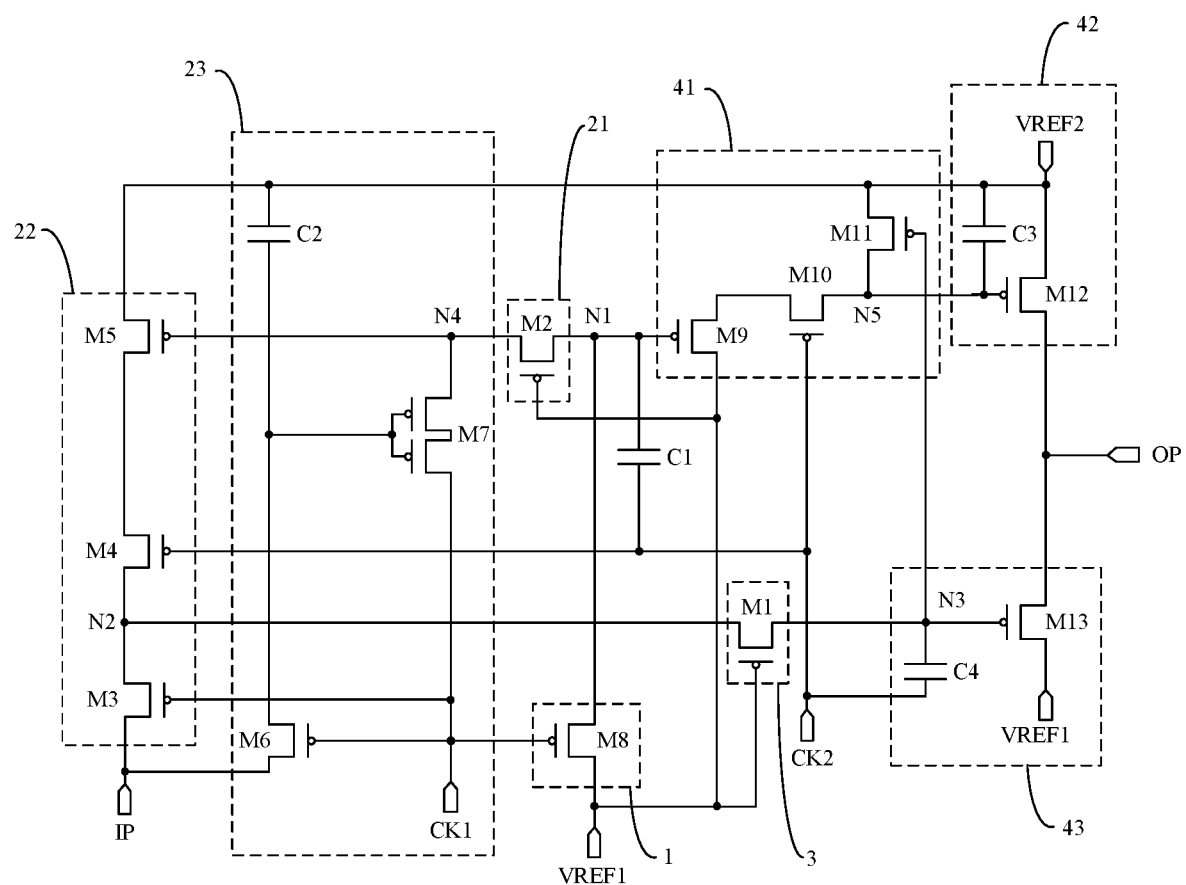
FIG. 5 is a specific structural schematic diagram of a shift register provided by an embodiment of the present disclosure.

In the embodiments of the present disclosure, as shown in FIG. 5, the protection sub-circuit 3 includes: a first transistor M1; where the gate of the first transistor M1 is electrically connected to the first reference signal end VREF1, the first electrode of the first transistor M1 is electrically connected to the second node N2, the second electrode of the transistor M1 is electrically connected to the third node N3.

In some embodiments, when the first transistor M1 is a P-type transistor, it is on when a relationship between a voltage difference $V_{gs}$ of the gate and the source of the first transistor M1 and a threshold voltage $V_{th}$ of the first transistor M1 satisfies $V_{gs}<V_{th}$, or it is off.

In some embodiments, when the first transistor M1 is an N-type transistor, it is on when the relationship between the voltage difference $V_{gs}$ of the gate and the source of the first transistor M1 and the threshold voltage $V_{th}$ of the first transistor M1 satisfies $V_{gs}>V_{th}$.

In some embodiments, after the first transistor M1 is on, a resistance value of an equivalent resistor of the first transistor M1 is relatively small. When a current flowing through the first transistor M1 is relatively low, a voltage drop across two ends of the first transistor M1 may be neglected, which may reduce the voltage loss.

In the embodiments of the present disclosure, as shown in FIG. 5, the first control sub-circuit 21 includes: a second transistor M2; where the gate of the second transistor M2 is electrically connected to the first reference signal end VREF1, the first electrode of the second transistor M2 is electrically connected to the fourth node N4, and the second electrode of the transistor M2 is electrically connected to the first node N1.

In the embodiments of the present disclosure, as shown in FIG. 5, the second control sub-circuit 22 includes: a third transistor M3, a fourth transistor M4 and a fifth transistor M5.

The gate of the third transistor M3 is electrically connected to the first clock signal end CK1, the first electrode of the third transistor M3 is electrically connected to the input signal end IP, and the second electrode of the third transistor M3 is electrically connected to the second node N2.

The gate of the fourth transistor M4 is electrically connected to the second clock signal end CK2, the first electrode of the fourth transistor M4 is electrically connected to the second node N2, and the second electrode of the fourth transistor M4 is electrically connected to the first electrode of the fifth transistor M5.

The gate of the fifth transistor M5 is electrically connected to the fourth node N4, and the second electrode of the fifth transistor M5 is electrically connected to the second reference signal end VREF2.

In the embodiments of the present disclosure, the third transistor M3 may provide the input signal of the input signal end IP to the second node N2 under the control of the first clock signal of the first clock signal end CK1. The fourth transistor M4 may make the second node N2 and the first electrode of the fifth transistor M5 on under the control of the second clock signal of the second clock signal end CK2. The fifth transistor M5 may make the second reference signal end VREF2 and the second electrode of the fourth transistor M4 on under the control of the fourth node signal of the fourth node N4.

In the embodiments of the present disclosure, as shown in FIG. 5, the third control sub-circuit 23 includes: a sixth transistor M6, a seventh transistor M7 and a second capacitor C2.

The gate of the sixth transistor M6 is electrically connected to the first clock signal end CK1, the first electrode of the sixth transistor M6 is electrically connected to the input signal end IP, and the second electrode of the sixth transistor M6 is electrically connected to the gate of the seventh transistor M7.

The first electrode of the seventh transistor M7 is electrically connected to the first clock signal end CK1, and the second electrode of the seventh transistor M7 is electrically connected to the fourth node N4.

The second capacitor C2 is electrically connected between the gate of the seventh transistor M7 and the second reference signal end VREF2.

In the embodiments of the present disclosure, the sixth transistor M6 may provide the input signal of the input signal end IP to the gate of the seventh transistor M7 under the control of the first clock signal of the first clock signal end CK1. The seventh transistor M7 may provide the first clock signal of the first clock signal end CK1 to the fourth node N4 under the control of the gate signal of the gate of the seventh transistor M7. The second capacitor C2 may store the voltages of the gate of the seventh transistor M7 and the second reference signal end VREF2.

In the embodiments of the present disclosure, as shown in FIG. 5, the seventh transistor M7 may be set as a double-gate-type transistor. In this way, a leakage current generated when the seventh transistor M7 is off may be reduced, so that the voltages of the fourth node N4 and the first node N1 may be further maintained, which is favorable for reducing interference of the leakage current of the seventh transistor M7 to the voltages of the fourth node N4 and the first node N1 and improving the output stability of the shift register. In some embodiments, the seventh transistor M7 may also be set as a single-gate-type transistor and is not limited herein.

Further, the transistors in the shift register may be all set as the double-gate-type transistors in consideration of the leakage current and are not limited herein.

In the embodiments of the present disclosure, as shown in FIG. 5, the input sub-circuit 1 includes: an eighth transistor M8; where the gate of the eighth transistor M8 is electrically connected to the first clock signal end CK1, the first electrode of the eighth transistor M8 is electrically connected to the first reference signal end VREF1, and the second electrode of the eighth transistor M8 is electrically connected to the first node N1.

In some embodiments, the eighth transistor M8 may provide the first reference signal of the first reference signal end VREF1 to the first node N1 under the control of the first clock signal of the first clock signal end CK1.

In the embodiments of the present disclosure, as shown in FIG. 5, the output control sub-circuit 41 includes: a ninth transistor M9, a tenth transistor M10 and an eleventh transistor M11.

The gate of the ninth transistor M9 is electrically connected to the first node N1, the first electrode of the ninth transistor M9 is electrically connected to the first reference signal end VREF1, and the second electrode of the ninth transistor M9 is electrically connected to the first electrode of the tenth transistor M10.

The gate of the tenth transistor M10 is electrically connected to the second clock signal end CK2, and the second electrode of the tenth transistor M10 is electrically connected to the fifth node N5.

The gate of the eleventh transistor M11 is electrically connected to the third node N3, the first electrode of the eleventh transistor M11 is electrically connected to the second reference signal end VREF2, and the second electrode of the eleventh transistor M11 is electrically connected to the fifth node N5.

In the embodiments of the present disclosure, the ninth transistor M9 may provide the first reference signal of the first reference signal end VREF1 to the first electrode of the tenth transistor M10 under the control of the first node signal of the first node N1. The tenth transistor M10 may make the second electrode of the ninth transistor M9 and the fifth node N5 on under the control of the second clock signal of the second clock signal end CK2. The eleventh transistor M11 provides the second reference signal of the second reference signal end VREF2 to the fifth node N5 under the control of the third node signal of the third node N3.

In the embodiments of the present disclosure, as shown in FIG. 5, the first output sub-circuit 42 includes: a twelfth transistor M12 and a third capacitor C3.

The gate of the twelfth transistor M12 is electrically connected to the fifth node N5, the first electrode of the twelfth transistor M12 is electrically connected to the second reference signal end VREF2, and the second electrode of the twelfth transistor M12 is electrically connected to the signal output end OP.

The third capacitor C3 is electrically connected between the gate of the twelfth transistor M12 and the second reference signal end VREF2.

In the embodiments of the present disclosure, the twelfth transistor M12 may provide the second reference signal of the second reference signal end VREF2 to the signal output end OP under the control of the fifth node signal of the fifth node N5. The third capacitor C3 may store the voltages of the gate of the twelfth transistor M12 and the second reference signal end VREF2.

In the embodiments of the present disclosure, as shown in FIG. 5, the second output sub-circuit 43 includes: a thirteenth transistor M13 and a fourth capacitor C4.

The gate of the thirteenth transistor M13 is electrically connected to the third node N3, the first electrode of the thirteenth transistor M13 is electrically connected to the first reference signal end VREF1, and the second electrode of the thirteenth transistor M13 is electrically connected to the signal output end OP.

The fourth capacitor C4 is electrically connected between the gate of the thirteenth transistor M13 and the second clock signal end CK2.

In the embodiments of the present disclosure, the thirteenth transistor M13 may provide the first reference signal of the first reference signal end VREF1 to the signal output end OP under the control of the third node signal of the third node N3. The fourth capacitor C4 may store the voltages of the gate of the thirteenth transistor M13 and the second clock signal end CK2.

When an effective pulse signal of the input signal end IP is a high-level signal, the first reference signal of the first reference signal end VREF1 is a low-level signal, and the second reference signal of the second reference signal end VREF2 is a high-level signal. When an effective pulse signal of the input signal end IP is a low-level signal, the first reference signal of the first reference signal end VREF1 is a high-level signal, and the second reference signal of the second reference signal end VREF2 is a low-level signal. It should be noted that when the effective pulse signal of the input signal end IP is input to the third node N3 through the third transistor M3, the second node N2 and the first transistor M1, the thirteenth transistor M13 may be controlled to be off. Furthermore, when the effective pulse signal of the input signal end IP is input to the gate of the seventh transistor M7 through the sixth transistor M6, the seventh transistor M7 may be controlled to be off.

The foregoing is only for exemplifying the specific structure of each sub-circuit in the shift register provided by the embodiment of the present disclosure, during specific implementation, the specific structure of each sub-circuit is not limited to the foregoing structure provided by the embodiment of the present disclosure, and may also be other structures known by persons skilled in the art and is not limited herein.

In order to simplify a preparation process, during specific implementation, in the shift register provided by the embodiment of the present disclosure, as shown in FIG. 5, all the transistors may be P-type transistors. Alternatively, all the transistors may also be N-type transistors. Furthermore, during specific implementation, the P-type transistors are off under the action of a high-level signal and on under the action of a low-level signal. The N-type transistors are on under the action of the high-level signal and off under the action of the low-level signal.

It shall be noted that each transistor mentioned in the above embodiments may be a Thin Film Transistor (TFT), or a Metal Oxide Semiconductor (MOS) field-effect transistor, and are not limited herein. During specific implementation, according to the signal of the gate of each transistor and the type of the transistor, the first electrode may be used as a source, and the second electrode may be used as a drain, or the first electrode is used as the drain, and the second electrode is used as the source. No specific distinction is made herein.

The structure of the shift register shown in FIG. 5 is exemplified below to describe the working process of the above-mentioned shift register provided by the embodiment of the present disclosure in conjunction with the circuit sequence diagram shown in FIG. 6.

In the following description, 1 denotes a high-level signal, and 0 denotes a low-level signal, where 1 and 0 represent logic levels which are merely for explanation of the working process of the above-mentioned shift register provided by the embodiments of the present disclosure, rather than indicating a specific voltage value applied to the gate of each transistor during the specific implementation.

Figure 6:
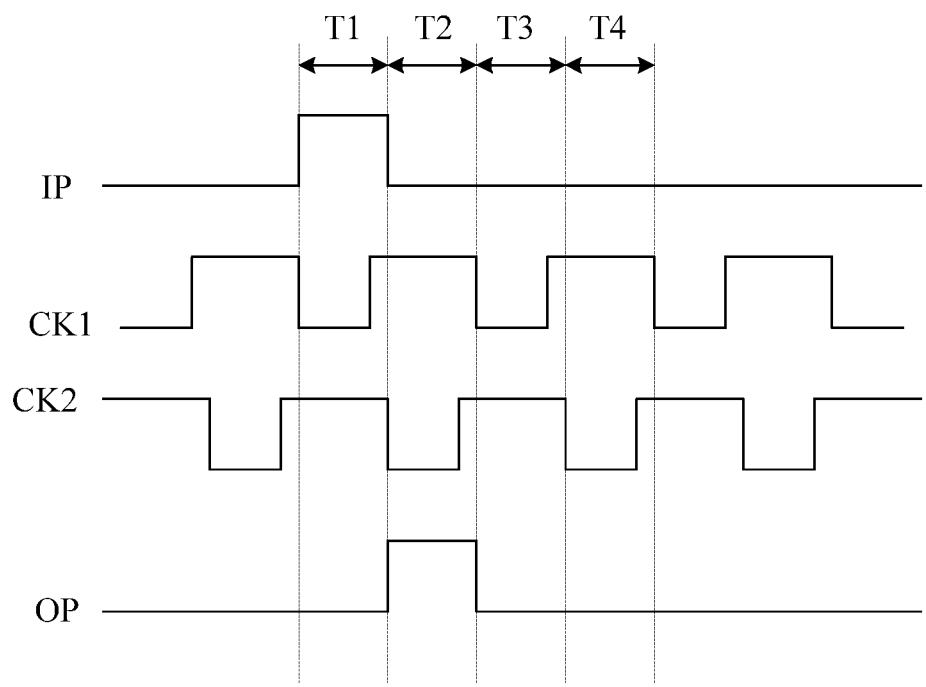
FIG. 6 is a circuit sequence diagram provided by an embodiment of the present disclosure.

In some embodiments, an input phase T1, an output phase T2, a reset phase T3 and a reset holding phase T4 in the circuit sequence diagram as shown in FIG. 6 are selected. The first reference signal of the first reference signal end VREF1 is a low-level signal, and the second reference signal of the second reference signal end VREF2 is a high-level signal.

In the input phase T1, IP is equal to 1, CK1 is equal to 0, and CK2 is equal to 1.

Since CK2 is equal to 1, the fourth transistor M4 and the tenth transistor M10 are both off. Since CK1 is equal to 0, the third transistor M3, the sixth transistor M6 and the eighth transistor M8 are all on.

The on third transistor M3 may provide the high-level signal of the input signal end IP to the second node N2 to enable the second node N2 to have the high-level signal. Since the first transistor M1 is on, the third node N3 has the high-level signal, and then, the eleventh transistor M11 and the thirteenth transistor M13 are controlled to be off.

The on sixth transistor M6 may provide the high-level signal of the input signal end IP to the seventh transistor M7 to control the seventh transistor M7 to be off.

The on eighth transistor M8 provides the low-level signal of the first reference signal end VREF1 to the first node N1 to enable the first node N1 to have the low-level signal. Since the second transistor M2 is on to make the first node N1 and the fourth node N4 on, the fourth node N4 has the low-level signal. Since the tenth transistor M10 is off, the fifth node N5 maintains the high-level signal in the previous frame to make the twelfth transistor M12 off, thereby enabling the signal output end OP to maintain the low-level signal in the previous frame.

In the output phase T2, IP is equal to 0, CK1 is equal to 1, and CK2 is equal to 0.

Since CK2 is equal to 0, the fourth transistor M4 and the tenth transistor M10 are both on. Since CK1 is equal to 1, the third transistor M3, the sixth transistor M6 and the eighth transistor M8 are all off.

Since the sixth transistor M6 is off, the second capacitor C2 maintains the gate of the seventh transistor M7 to have the high-level signal to control the seventh transistor M7 to be off.

Since the eighth transistor M8 is off, the first capacitor C1 maintains the level of the first node N1 as the low level.

At the beginning of the output phase T2, the second transistor M2 is still in an on state, and the level of the fourth node N4 is also the low level. However, since the second clock signal end CK2 is changed from the high-level signal to the low-level signal, the level of the first node N1 is further pulled down under the action of the first capacitor C1 to make $V_{gs}$ and $V_{th}$ of the second transistor M2 not satisfy $V_{gs} < V_{th}$ to make the second transistor M2 off, thereby disconnecting the first node N1 and the fourth node N4 to prevent the level of the fourth node N4 from being further pulled down. Therefore, the problem of extremely high leakage current caused by a long-time bias voltage state of the seventh transistor M7 may be avoided, and the output stability is improved.

Since the level of the fourth node N4 is the low level, the fifth transistor M5 is on. The on fifth transistor M5 and fourth transistor M4 may provide the high-level signal of the second reference signal end VREF2 to the second node N2 to make the signals of the second node N2 and the third node N3 be the high-level signals, thereby controlling the eleventh transistor M11 and the thirteenth transistor M13 to be off. Since the level of the first node N1 is further pulled down, the ninth transistor M9 is on. The on ninth transistor M9 and tenth transistor M10 may provide the low-level signal of the first reference signal end VREF1 to the fifth node N5 to make the level of the fifth node N5 be the low level, thereby controlling the twelfth transistor M12 to be on. The on twelfth transistor M12 may provide the high-level signal of the second reference signal end VREF2 to the signal output end OP to make the signal output end OP to output the high-level signal.

In the reset phase T3, IP is equal to 0, CK1 is equal to 0, and CK2 is equal to 1.

Since CK2 is equal to 1, the fourth transistor M4 and the tenth transistor M10 are both off. Since CK1 is equal to 0, the third transistor M3, the sixth transistor M6 and the eighth transistor M8 are all on.

The on eighth transistor M8 provide the low-level signal of the first reference signal end VREF1 to the first node N1 to enable the first node N1 to have the low-level signal. Since the second transistor M2 is on to make the first node N1 and the fourth node N4 on, the fourth node N4 has the low-level signal.

The on sixth transistor M6 provides the low-level signal of the input signal end IP to the gate of the seventh transistor M7, so that the low-level signal is stored through the second capacitor C2, and the seventh transistor M7 is controlled to be on, so that the low-level signal of the first clock signal end CK1 is provided to the fourth node N4. However, the fourth transistor M4 is off, so that the high-level signal of the second reference signal end may not be transmitted to the second node N2. The on third transistor M3 may provide the low-level signal of the input signal end IP to the second node N2 to enable the second node N2 to have the low-level signal. Since the first transistor M1 is on, the third node N3 has the low-level signal, and then, the eleventh transistor M11 and the thirteenth transistor M13 are controlled to be on. The on eleventh transistor M11 may provide the high-level signal of the second reference signal end VREF2 to the fifth node N5 to control the twelfth transistor M12 to be off. The on thirteenth transistor M13 may provide the low-level signal of the first reference signal end VREF1 to the signal output end OP to enable the signal output end OP to output the low-level signal.

In the reset holding phase T4, IP is equal to 0, CK1 is equal to 1, and CK2 is equal to 0.

Since CK2 is equal to 0, the fourth transistor M4 and the tenth transistor M10 are both on. Since CK1 is equal to 1, the third transistor M3, the sixth transistor M6 and the eighth transistor M8 are all off.

Since the sixth transistor M6 is off, the second capacitor C2 maintains the gate of the seventh transistor M7 to have the low-level signal to control the seventh transistor M7 to be on, thereby providing the high-level signal of the first clock signal end CK1 to the fourth node N4, to make the fourth node N4 have the high-level signal.

Since the fourth node N4 has the high-level signal, the first node N1 also has the high-level signal, and the fifth transistor M5 and the ninth transistor M9 are off. Therefore, influences of the high-level signal of the second reference signal end VREF2 to the second node N2 and influences of the low-level signal of the first reference signal end VREF1 to the fifth node N5 may be avoided. Therefore, the fifth node N5 is maintained to have the high-level signal by the third capacitor C3 to control the twelfth transistor M12 to be off. The third node N3 is maintained to have the low-level signal by the fourth capacitor C4.

Furthermore, since the second clock signal end CK2 jumps from the high-level signal to the low-level signal, the level of the third node N3 is further pulled down under the action of the fourth capacitor C4 to make $V_{gs}$ and $V_{th}$ of the first transistor M1 not satisfy $V_{gs} < V_{th}$ so as to make the first transistor M1 off, thereby disconnecting the second node N2 and the third node N3 to prevent the level of the second node N2 from being further pulled down. Therefore, the problem of extremely high leakage current caused by a long-time bias voltage state of the third transistor M3 may be avoided, and the output stability is improved. Further, the level of the third node N3 is further pulled down, so that the thirteenth transistor M13 may be on as completely as possible, and then, the low-level signal of the first reference signal end VREF1 is provided to the signal output end OP to enable the signal output end OP to output the low-level signal.

In the above shift register provided by the embodiments of the present disclosure, after the T4 phase, the working processes of the T3 phase and the T4 phase are repeatedly executed all the time till a next frame begins.

In the embodiments, through the arrangement of the first transistor M1, when the level of the third node N3 is further pulled down, the first transistor M1 may be off under the control of its gate-source voltage (a voltage between the gate of the first transistor M1 and the third node N3), thereby preventing the level of the second node N2 from being further pulled down, then, preventing the third transistor M3 from being under a relatively large bias voltage, preventing the threshold voltage of the third transistor M3 from being biased, and improving the stability of the shift register.

Figure 7:
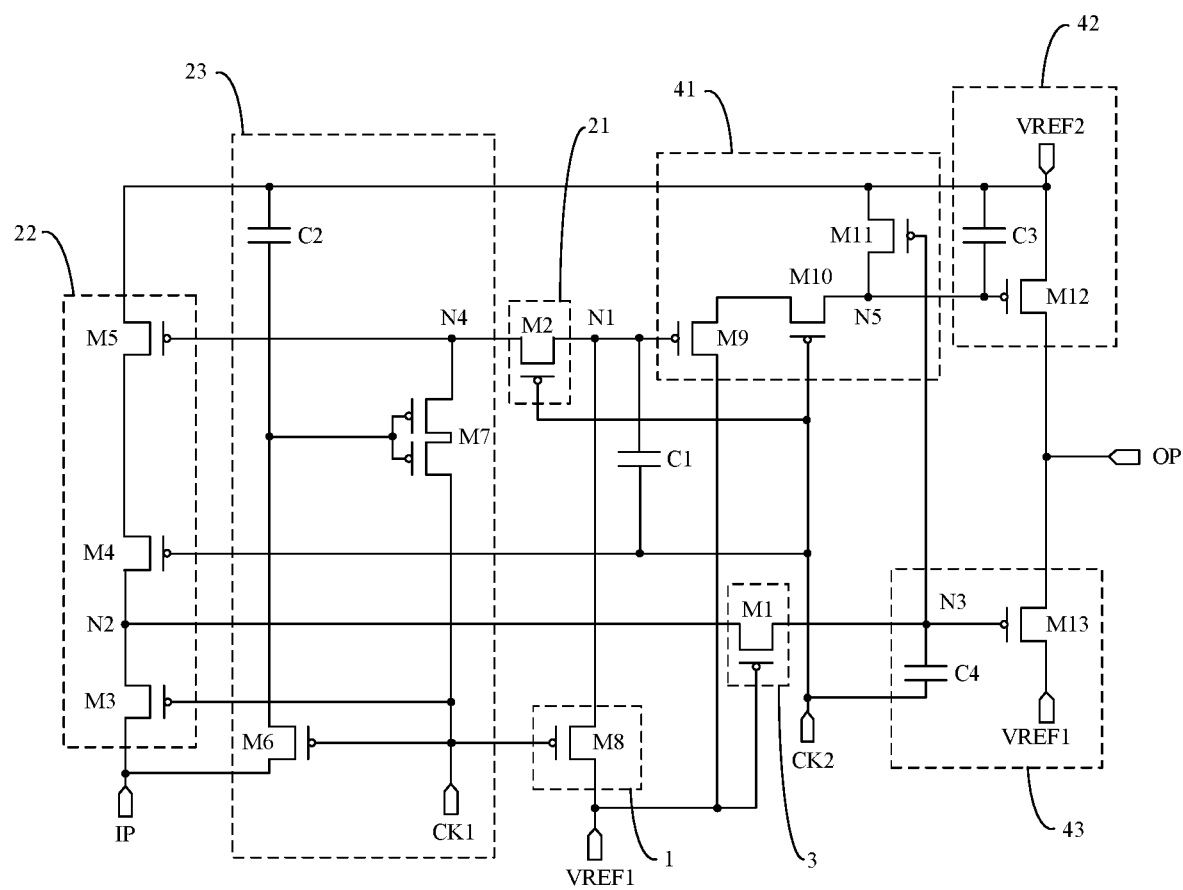
FIG. 7 is a specific structural schematic diagram of another shift register provided by an embodiment of the present disclosure.

An embodiment of the present disclosure provides another shift register, as shown in FIG. 7. Modifications are made to part of implementations in the above embodiment. Only differences of the present embodiment and the above embodiment are explained below, and similarities of the present embodiment and the above embodiment are omitted herein.

In the embodiments of the present disclosure, as shown in FIG. 7, the first control sub-circuit 21 includes: a second transistor M2; where the gate of the second transistor M2 is electrically connected to the second clock signal end CK2, the first electrode of the second transistor M2 is electrically connected to the fourth node N4, and the second electrode of the transistor M2 is electrically connected to the first node N1.

The second transistor M2 may make the fourth node N4 and the first node N1 on or off under the control of the second clock signal of the second clock signal end CK2. In this way, the gate of the second transistor M2 receives the second clock signal of the second clock signal end CK2, thereby avoiding the problem of threshold voltage shift as the second transistor M2 is under the same bias voltage for a long time.

The structure of the shift register shown in FIG. 7 is exemplified below to describe the working process of the above-mentioned shift register provided by the embodiment of the present disclosure in conjunction with the circuit sequence diagram shown in FIG. 6.

In the following description, 1 denotes a high-level signal, and 0 denotes a low-level signal, wherein 1 and 0 represent logic levels which are for explanation of the working process of the above-mentioned shift register provided by the embodiment of the present disclosure, rather than indicating a specific voltage value applied to the gate of each transistor during the specific implementation.

In some embodiments, an input phase T1, an output phase T2 and a reset phase T3 in the circuit sequence diagram as shown in FIG. 6 are selected. The first reference signal of the first reference signal end VREF1 is the low-level signal, and the second reference signal of the second reference signal end VREF2 is the high-level signal.

In the input phase T1, IP is equal to 1, CK1 is equal to 0, and CK2 is equal to 1.

Since CK2 is equal to 1, the second transistor M2, the fourth transistor M4 and the tenth transistor M10 are all off. Since CK1 is equal to 0, the third transistor M3, the sixth transistor M6 and the eighth transistor M8 are all on.

The on third transistor M3 may provide the high-level signal of the input signal end IP to the second node N2 to enable the second node N2 to have the high-level signal.

Since the first transistor M1 is on, the third node N3 has the high-level signal, and then, the eleventh transistor M11 and the thirteenth transistor M13 are controlled to be off.

The on sixth transistor M6 may provide the high-level signal of the input signal end IP to the seventh transistor M7 to control the seventh transistor M7 to be off.

The on eighth transistor M8 provides the low-level signal of the first reference signal end VREF1 to the first node N1 to enable the first node N1 to have the low-level signal.

Since the second transistor M2 is off, the fourth node N4 maintains the high-level signal of the previous frame, and the fifth transistor M5 is controlled to be off. Since the tenth transistor M10 is off, the fifth node N5 maintains the high-level signal in the previous frame to make the twelfth transistor M12 off, thereby enabling the signal output end OP to maintain the low-level signal in the previous frame.

In the output phase T2, IP is equal to 0, CK1 is equal to 1, and CK2 is equal to 0.

Since CK2 is equal to 0, at the moment of entering the output phase T2, the second transistor M2 is also on to make the level of the fourth node N4 be the low level. However, since the second clock signal end CK2 is changed from the high-level signal to the low-level signal, the level of the first node N1 is further pulled down under the action of the first capacitor C1 to make $V_{gs}$ and $V_{th}$ of the second transistor M2 not satisfy $V_{gs}<V_{th}$ to make the second transistor M2 off, thereby disconnecting the first node N1 and the fourth node N4 to prevent the level of the fourth node N4 from being further pulled down. Therefore, the problem of extremely high leakage current caused by a long-time bias voltage state of the seventh transistor M7 may be avoided, and the output stability is improved. The rest working process of this phase may be basically the same as the working process of the output phase T2 in the above embodiment, and descriptions thereof are omitted herein.

In the reset phase T3, IP is equal to 0, CK1 is equal to 0, and CK2 is equal to 1.

Since CK2 is equal to 1, the second transistor M2, the fourth transistor M4 and the tenth transistor M10 are all off. The rest working process of this phase may be basically the same as the working process of the reset phase T3 in the above embodiment, and descriptions thereof are omitted herein.

In the reset holding phase T4, IP is equal to 0, CK1 is equal to 1, and CK2 is equal to 0. Since CK2 is equal to 0, the second transistor M2, the fourth transistor M4 and the tenth transistor M10 are all on. The rest working process of this phase may be basically the same as the working process of the reset holding phase T4 in the above embodiment, and descriptions thereof are omitted herein.

In the above shift register provided by the embodiment of the present disclosure, after the T4 phase, the working processes of the T3 phase and the T4 phase are repeatedly executed all the time till a next frame begins.

The foregoing only takes the P-type transistor as an example. When each transistor in the above shift register is the N-type transistor, the working process may refer to the working process in the above embodiment, in which a high-level signal of the gate of each transistor is only changed into a low-level signal and a low-level signal of the gate of each transistor is changed into a high-level signal, and descriptions thereof are omitted herein.

Therefore, the shift register provided by the embodiment of the present disclosure may use the high/low-level signal as the effective pulse signal of the input signal end IP to realize shifting output of the signal, and thus, the shift register may be used as either a scanning driving circuit or a light emitting driving circuit applied to a display panel.

Figure 8:
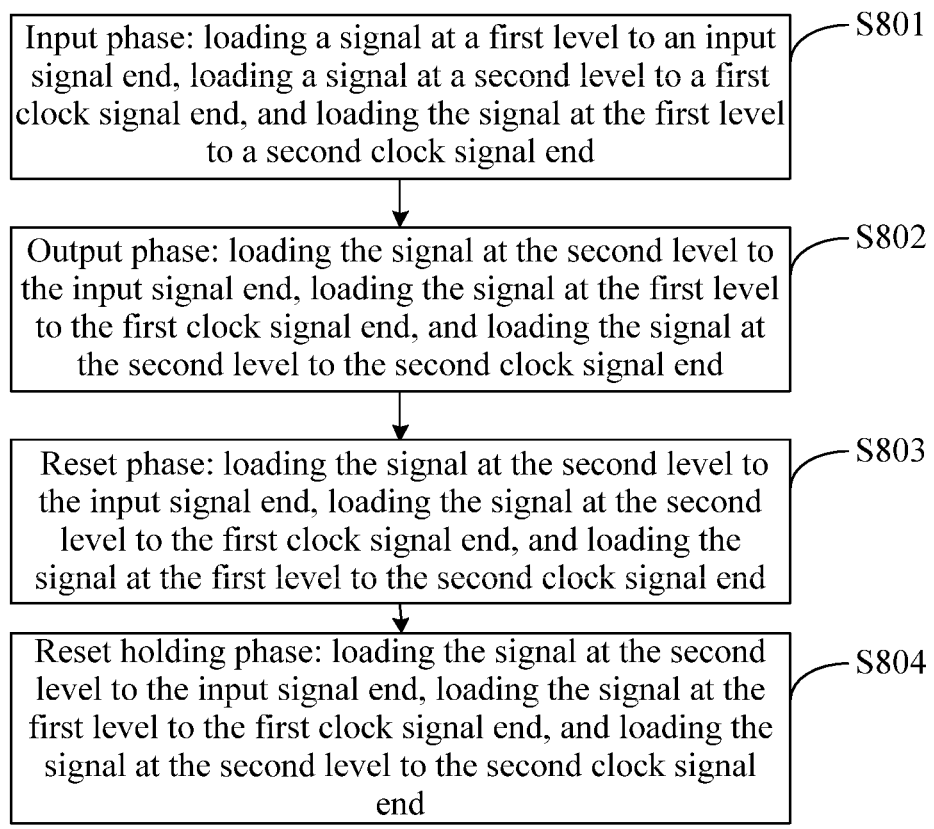
FIG. 8 is a flow diagram of a driving method provided by an embodiment of the present disclosure.

Based on the same inventive concept, an embodiment of the present disclosure further provides a driving method of any one of the above shift registers provided by the embodiments of the present disclosure, as shown in FIG. 8, including the following operations.

S801, an input phase: a signal at a first level is loaded to an input signal end IP, a signal at a second level is loaded to a first clock signal end CK1, and the signal at the first level is loaded to a second clock signal end CK2.

S802, an output phase: the signal at the second level is loaded to the input signal end IP, the signal at the first level is loaded to the first clock signal end CK1, and the signal at the second level is loaded to the second clock signal end CK2.

S803, a reset phase: the signal at the second level is loaded to the input signal end IP, the signal at the second level is loaded to the first clock signal end CK1, and the signal at the first level is loaded to the second clock signal end CK2.

S804, a reset holding phase: the signal at the second level is loaded to the input signal end IP, the signal at the first level is loaded to the first clock signal end CK1, and the signal at the second level is loaded to the second clock signal end CK2.

The driving method provided by the embodiment of the present disclosure may enable the shift register to stably output a signal. During specific implementation, in the above driving method provided by the embodiment of the present disclosure, the first level may be a high level, and correspondingly, the second level may be a low level. On the contrary, the first level may be the low level, and correspondingly, the second level may be the high level. They are specifically determined according to whether each transistor in the shift register is an N-type transistor or a P-type transistor.

In some embodiments, FIG. 6 illustrates a circuit sequence diagram of the transistor (P-type transistor) in the shift register. The first level is the high level, and the second level is the low level.

Figure 9:
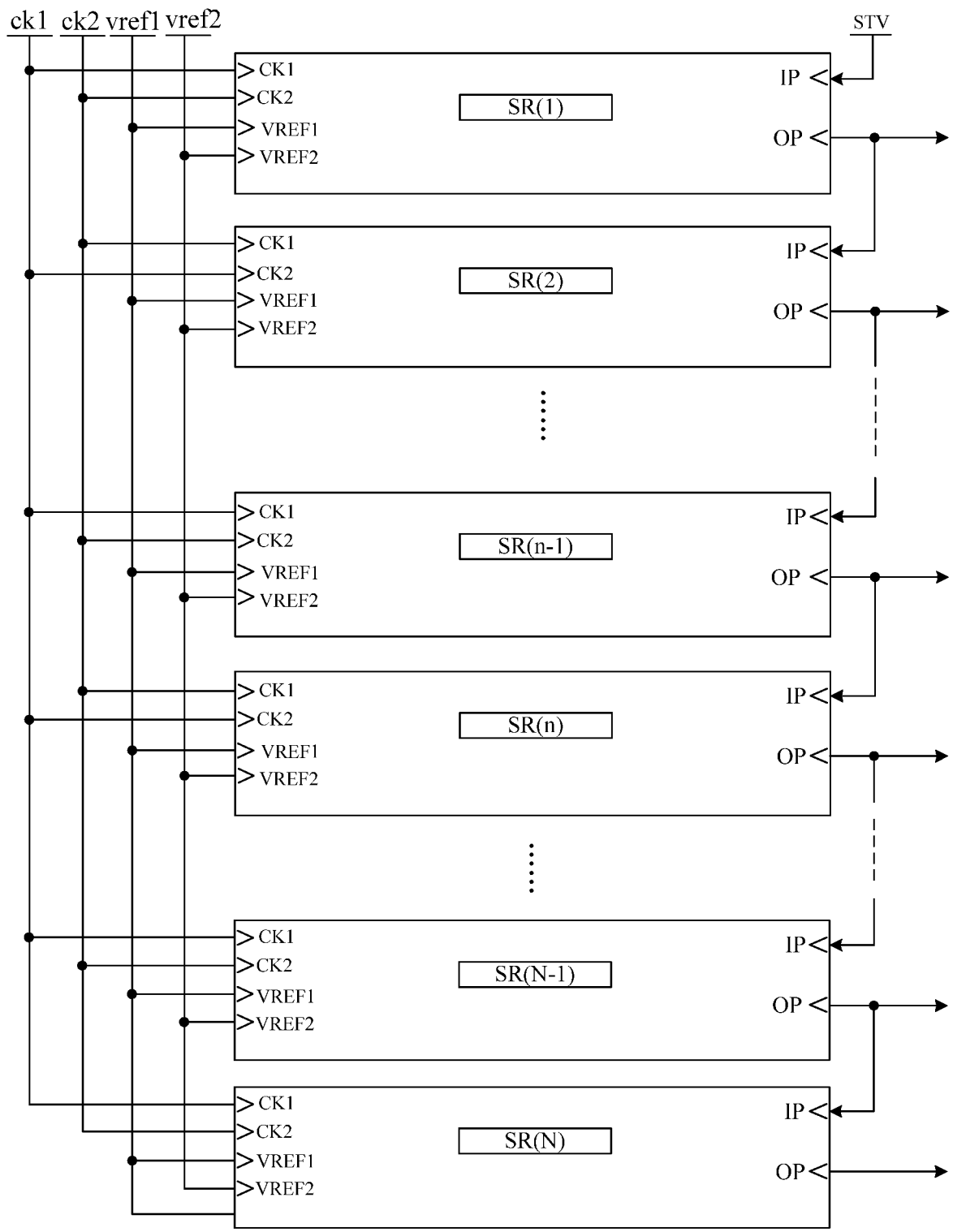
FIG. 9 is a structural schematic diagram of a driving control circuit provided by an embodiment of the present disclosure.

Based on the same inventive concept, an embodiment of the present disclosure further provides a driving control circuit, as shown in FIG. 9, including a plurality of any shift registers cascaded: SR(1), SR(2) . . . SR(n) . . . SR(N−1), SR(N) (total N shift registers, n being greater than or equal to 1 and smaller than or equal to N) provided by the embodiments of the present disclosure.

An input signal end IP of the first stage of shift register SR(1) is connected to a frame triggering signal end STV.

In every two adjacent stages of shift registers, an input signal end of the next stage of shift register SR(n) is electrically connected to an output signal end OP of the previous stage of shift register SR(n−1).

During specific implementation, as shown in FIG. 9, a first clock signal end CK1 of the (2k−1)th stage of shift register and a second clock signal end CK2 of the 2kth stage of shift register are both connected to the same clock end, namely a first clock end ck1. A second clock signal end CK2 of the (2k−1)th stage of shift register and a first clock signal end CK1 of the 2k-th stage of shift register are both connected to the same clock end, namely a second clock end ck2, where k is a positive integer.

In some embodiments, as shown in FIG. 9, a first reference signal end VREF1 of each stage of shift register SR(n) is connected to the same signal end, namely a first reference end vref1, and a second reference signal end VREF2 of each stage of shift register SR(n) is connected to the same signal end, namely a second reference end vref2.

Specifically, the specific structure of each shift register in the driving control circuit is the same as the above shift register of the present disclosure in function and structure, and repeated descriptions are omitted.

In some embodiments, the driving control circuit provided by the embodiment of the present disclosure may be used as a gate driving circuit applied to providing a gate scanning signal of a scanning control transistor.

In some embodiments, the driving control circuit provided by the embodiment of the present disclosure may be used as a light emitting driving circuit applied to providing a light emitting control signal of a light emitting control transistor.

Based on the same inventive concept, an embodiment of the present disclosure further provides a display device, including any one of the above driving control circuits provided by the embodiments of the present disclosure. The principle of the display device for solving problems is similar to that of the shift register, so that the implementation of the display device may refer to that of the shift register, and repeated descriptions are omitted.

In some embodiments, the display device provided by the embodiment of the present disclosure may be an Organic Light Emitting Diode (OLED) display device, or a liquid crystal display device and is not limited herein.

The OLED display device is generally provided with a plurality of OLEDs and pixel circuits connected to the OLEDs. Generally, light emitting control transistors for controlling the OLEDs to emit light and scanning control transistors for controlling data signal input are arranged in the pixel circuits. During specific implementation, when the above display device provided by the embodiment of the present disclosure is the OLED display device, the OLED display device may include one driving control circuit provided by the embodiment of the present disclosure, the driving control circuit may be used as a light emitting driving circuit applied to providing a light emitting control signal of the light emitting control transistor, or the driving control circuit may also be used as a gate driving circuit applied to providing a gate scanning signal of the scanning control transistor. Of course, the OLED display device may also include two driving control circuits provided by the embodiment of the present disclosure. One driving control circuit may be used as the light emitting driving circuit applied to providing a light emitting control signal of a light emitting control transistor, and the other driving control circuit is the gate driving circuit applied to providing a gate scanning signal of a scanning control transistor, there are no limits herein.

The liquid crystal display device is generally provided with a plurality of pixel electrodes and switching transistors connected to the pixel electrodes. In some embodiments, when the display device provided by the embodiment of the present disclosure is the liquid crystal display device, the driving control circuit provided by the embodiment of the present disclosure may be used as the gate driving circuit applied to providing gate scanning signals of the switching transistors.

Figure 10:
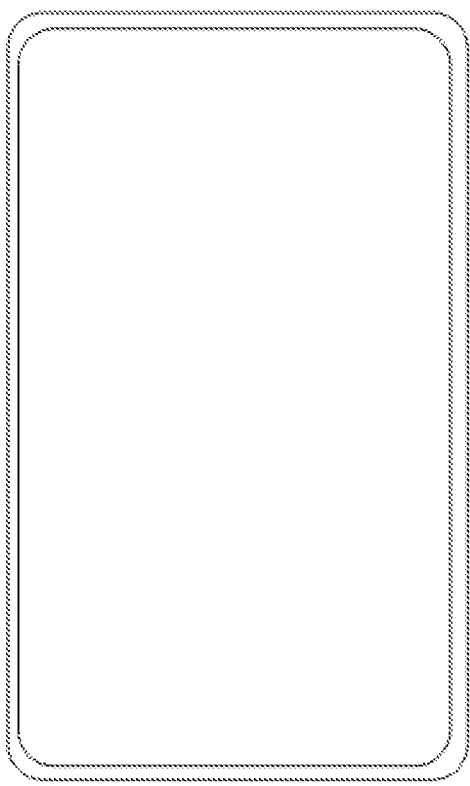
FIG. 10 is a structural schematic diagram of a display device provided by an embodiment of the present disclosure.

In some embodiments, the display device provided by the embodiment of the present disclosure may be a full-screen phone shown in FIG. 10.

In some embodiments, the display device may also be any product or component having a display function, such as a tablet computer, a television, a display, a notebook computer, a digital photo frame and a navigator. Other indispensable components of the display device are all understood by those skilled in the art, are not described herein and should not be constructed as a limit to the present disclosure.

According to the shift register, the driving method thereof, the driving control circuit and the display device which are provided by the embodiments of the present disclosure, the first reference signal of the first reference signal end may be provided to the first node through the input sub-circuit in response to the first clock signal of the first clock signal end. The first node and second node signals of the first node and the second node may be controlled through the driving control sub-circuit according to the input signal end, the first clock signal end and the second clock signal end. The first reference signal of the first reference signal end may be provided to the signal output end in response to the third node signal of the third node, and the second reference signal of the second reference signal end may be provided to the signal output end in response to the first node and second clock signals of the first node and the second clock signal end through the output sub-circuit. Through the arrangement of the first capacitor electrically connected between the second clock signal end and the first node, a level of the first node may be kept stable through the first capacitor. The second node and third node signals of the second node and the third node may be controlled through the protection sub-circuit in response to the first reference signal of the first reference signal end, therefore, when the third node is further pulled down, the third node and the second node may be disconnected to avoid the second node from being further pulled down, thereby reducing influences of the second node signal of the second node to the driving control sub-circuit, and then, improving the output stability of the shift register.

What is claimed is:

1. A shift register, comprising:
    an input sub-circuit configured to provide a first reference signal of a first reference signal end to a first node in response to a first clock signal of a first clock signal end;
    a first capacitor electrically connected between a second clock signal end and the first node;
    a driving control sub-circuit configured to control a first node signal of the first node and a second node signal of a second node according to an input signal of an input signal end, the first clock signal of the first clock signal end and a second clock signal of the second clock signal end;
    a protection sub-circuit configured to control the second node signal of the second node and a third node signal of a third node in response to the first reference signal of the first reference signal end; and
    an output sub-circuit configured to provide the first reference signal of the first reference signal end to a signal output end in response to the third node signal of the third node, and further configured to provide a second reference signal of a second reference signal end to the signal output end in response to the first node signal of the first node and the second clock signal of the second clock signal end.

2. The shift register according to claim 1, wherein the protection sub-circuit comprises:
a first transistor, wherein
a first gate of the first transistor is electrically connected to the first reference signal end, a first electrode of the first transistor is electrically connected to the second node, and a second electrode of the first transistor is electrically connected to the third node.

3. The shift register according to claim 1, wherein the driving control sub-circuit comprises:
a first control sub-circuit,
a second control sub-circuit, and
a third control sub-circuit;
wherein the first control sub-circuit is configured to control the first node signal of the first node and a fourth node signal of a fourth node;
wherein the second control sub-circuit is configured to control the second node signal of the second node according to the input signal of the input signal end, the first clock signal of the first clock signal end, the second clock signal of the second clock signal end and the fourth node signal of the fourth node; and
wherein the third control sub-circuit is configured to control the fourth node signal of the fourth node according to the first clock signal of the first clock signal end and the input signal of the input signal end.

4. The shift register according to claim 3, wherein the first control sub-circuit comprises: a second transistor;
wherein a first electrode of the second transistor is electrically connected to the fourth node, and a second electrode of the second transistor is electrically connected to the first node; and
wherein a gate of the second transistor is electrically connected to the first reference signal end; or a gate of the second transistor is electrically connected to the second clock signal end.

5. The shift register according to claim 3, wherein the second control sub-circuit comprises:
a third transistor,
a fourth transistor, and
a fifth transistor;
wherein a gate of the third transistor is electrically connected to the first clock signal end, a first electrode of the third transistor is electrically connected to the input signal end, and a second electrode of the third transistor is electrically connected to the second node;
wherein a gate of the fourth transistor is electrically connected to the second clock signal end, a first electrode of the fourth transistor is electrically connected to the second node, and a second electrode of the fourth transistor is electrically connected to a first electrode of the fifth transistor; and
wherein a gate of the fifth transistor is electrically connected to the fourth node, and a second electrode of the fifth transistor is electrically connected to the second reference signal end.

6. The shift register according to claim 3, wherein the third control sub-circuit comprises:
a sixth transistor,
a seventh transistor, and
a second capacitor;
wherein a gate of the sixth transistor is electrically connected to the first clock signal end, a first electrode of the sixth transistor is electrically connected to the input signal end, and a second electrode of the sixth transistor is electrically connected to a gate of the seventh transistor;
wherein a first electrode of the seventh transistor is electrically connected to the first clock signal end, and a second electrode of the seventh transistor is electrically connected to the fourth node; and
wherein the second capacitor is electrically connected between the gate of the seventh transistor and the second reference signal end.

7. The shift register according to claim 6, wherein the seventh transistor comprises a double-gate-type transistor.

8. The shift register according to claim 1, wherein the input sub-circuit comprises: an eighth transistor; wherein
a gate of the eighth transistor is electrically connected to the first clock signal end, a first electrode of the eighth transistor is electrically connected to the first reference signal end, and a second electrode of the eighth transistor is electrically connected to the first node.

9. The shift register according to claim 1, wherein the output sub-circuit comprises:
an output control sub-circuit,
a first output sub-circuit, and
a second output sub-circuit;
wherein the output control sub-circuit is configured to provide the first reference signal of the first reference signal end to a fifth node in response to the first node signal of the first node and the second clock signal of the second clock signal end, and provide the second reference signal of the second reference signal end to the fifth node in response to the third node signal of the third node;
wherein the first output sub-circuit is configured to provide the second reference signal of the second reference signal end to the signal output end in response to a fifth node signal of the fifth node; and
wherein the second output sub-circuit is configured to provide the first reference signal of the first reference signal end to the signal output end in response to the third node signal of the third node.

10. The shift register according to claim 9, wherein the output control sub-circuit comprises:
a ninth transistor,
a tenth transistor, and
an eleventh transistor;
wherein a gate of the ninth transistor is electrically connected to the first node, a first electrode of the ninth transistor is electrically connected to the first reference signal end, and a second electrode of the ninth transistor is electrically connected to a first electrode of the tenth transistor;
wherein a gate of the tenth transistor is electrically connected to the second clock signal end, and a second electrode of the tenth transistor is electrically connected to the fifth node; and
wherein a gate of the eleventh transistor is electrically connected to the third node, a first electrode of the eleventh transistor is electrically connected to the second reference signal end, and a second electrode of the eleventh transistor is electrically connected to the fifth node.

11. The shift register according to claim 9, wherein the first output sub-circuit comprises:
a twelfth transistor, and
a third capacitor;
wherein a gate of the twelfth transistor is electrically connected to the fifth node, a first electrode of the twelfth transistor is electrically connected to the second reference signal end, and a second electrode of the twelfth transistor is electrically connected to the signal output end; and wherein the third capacitor is electrically connected between the gate of the twelfth transistor and the second reference signal end.

12. The shift register according to claim 9, wherein the second output sub-circuit comprises:
a thirteenth transistor, and
a fourth capacitor;
wherein a gate of the thirteenth transistor is electrically connected to the third node, a first electrode of the thirteenth transistor is electrically connected to the first reference signal end, and a second electrode of the thirteenth transistor is electrically connected to the signal output end; and
wherein the fourth capacitor is electrically connected between the gate of the thirteenth transistor and the second clock signal end.

13. A driving control circuit, comprising a plurality of cascaded shift registers according to claim 1, wherein
a signal input end of a first stage of shift register is electrically connected to a frame triggering signal end; and
in every two adjacent stages of shift registers, a signal input end of a next stage of shift register is electrically connected to a signal output end of a previous stage of shift register.

14. A method of driving the shift register according to claim 1, the method comprising:
loading a first signal at a first level to the input signal end, loading a second signal at a second level to the first clock signal end, and loading the first signal at the first level to the second clock signal end;
loading the second signal at the second level to the input signal end, loading the first signal at the first level to the first clock signal end, and loading the second signal at the second level to the second clock signal end;
loading the second signal at the second level to the input signal end, loading the second signal at the second level to the first clock signal end, and loading the first signal at the first level to the second clock signal end; and
loading the second signal at the second level to the input signal end, loading the first signal at the first level to the first clock signal end, and loading second the signal at the second level to the second clock signal end.

15. A display device, comprising a shift register, wherein the shift register comprises:
an input sub-circuit configured to provide a first reference signal of a first reference signal end to a first node in response to a first clock signal of a first clock signal end;
a first capacitor electrically connected between a second clock signal end and the first node;
a driving control sub-circuit configured to control a first node signal of the first node and a second node signal of a second node according to an input signal of an input signal end, the first clock signal of the first clock signal end and a second clock signal of the second clock signal end;
a protection sub-circuit configured to control the second node signal of the second node and a third node signal of a third node in response to the first reference signal of the first reference signal end; and
an output sub-circuit configured to provide the first reference signal of the first reference signal end to a signal output end in response to the third node signal of the third node, and further configured to provide a second reference signal of a second reference signal end to the signal output end in response to the first node signal of the first node and the second clock signal of the second clock signal end.

16. The display device according to claim 15, wherein the protection sub-circuit comprises:
a first transistor, wherein
a gate of the first transistor is electrically connected to the first reference signal end; a first electrode of the first transistor is electrically connected to the second node; and a second electrode of the first transistor is electrically connected to the third node.

17. The display device according to claim 15, wherein the driving control sub-circuit comprises:
a first control sub-circuit,
a second control sub-circuit, and
a third control sub-circuit;
wherein the first control sub-circuit is configured to control the first node signal of the first node and a fourth node signal of a fourth node;
wherein the second control sub-circuit is configured to control the second node signal of the second node according to the input signal of the input signal end, the first clock signal of the first clock signal end, the second clock signal of the second clock signal end and the fourth node signal of the fourth node; and
wherein the third control sub-circuit is configured to control the fourth node signal of the fourth node according to the first clock signal of the first clock signal end and the input signal of the input signal end.

18. The display device according to claim 17, wherein the first control sub-circuit comprises: a second transistor;
wherein a first electrode of the second transistor is electrically connected to the fourth node, and a second electrode of the second transistor is electrically connected to the first node; and
wherein a gate of the second transistor is electrically connected to the first reference signal end; or a gate of the second transistor is electrically connected to the second clock signal end.

19. The display device according to claim 17, wherein the second control sub-circuit comprises:
a third transistor,
a fourth transistor, and
a fifth transistor;
wherein a gate of the third transistor is electrically connected to the first clock signal end, a first electrode of the third transistor is electrically connected to the input signal end, and a second electrode of the third transistor is electrically connected to the second node;
wherein a gate of the fourth transistor is electrically connected to the second clock signal end, a first electrode of the fourth transistor is electrically connected to the second node, and a second electrode of the fourth transistor is electrically connected to a first electrode of the fifth transistor; and
wherein a gate of the fifth transistor is electrically connected to the fourth node, and a second electrode of the fifth transistor is electrically connected to the second reference signal end.

20. The display device according to claim 17, wherein the third control sub-circuit comprises:
a sixth transistor,
a seventh transistor, and
a second capacitor;

wherein a gate of the sixth transistor is electrically connected to the first clock signal end, a first electrode of the sixth transistor is electrically connected to the input signal end, and a second electrode of the sixth transistor is electrically connected to a gate of the seventh transistor;

wherein a first electrode of the seventh transistor is electrically connected to the first clock signal end, and a second electrode of the seventh transistor is electrically connected to the fourth node; and wherein the second capacitor is electrically connected between the gate of the seventh transistor and the second reference signal end.

\* \* \* \* \*